(12) United States Patent
Bacos et al.

(10) Patent No.: US 8,591,992 B2
(45) Date of Patent: Nov. 26, 2013

(54) METHOD FOR FORMING A PROTECTIVE COATING AGAINST HIGH-TEMPERATURE OXIDATION ON A REFRACTORY COMPOSITE MATERIAL BASED ON SILICON AND NIOBIUM

(75) Inventors: Marie-Pierre Bacos, Antony (FR); Pierre Josso, Erquy (FR)

(73) Assignee: ONERA (Office National d'Etudes et de Recherches Aérospatiales, Châtillon (FR)

( * ) Notice: Subject to any disclaimer, the term of this patent is extended or adjusted under 35 U.S.C. 154(b) by 66 days.

(21) Appl. No.: 13/243,364

(22) Filed: Sep. 23, 2011

(65) Prior Publication Data
US 2012/0082857 A1 Apr. 5, 2012

(30) Foreign Application Priority Data
Sep. 30, 2010 (FR) ...................... 10 03882

(51) Int. Cl.
*C23C 8/28* (2006.01)
*B32B 18/00* (2006.01)
(52) U.S. Cl.
USPC .................. 427/255.4; 427/248.1; 427/372.2; 427/376.2
(58) Field of Classification Search
None
See application file for complete search history.

(56) References Cited

U.S. PATENT DOCUMENTS

| 4,904,546 A | 2/1990 | Jackson |
| 4,980,244 A | 12/1990 | Jackson |
| 5,019,334 A | 5/1991 | Jackson |
| 5,360,638 A * | 11/1994 | Lequertier .................. 427/257 |
| 5,932,033 A | 8/1999 | Jackson et al. |
| 6,419,765 B1 | 7/2002 | Jackson et al. |
| 6,521,356 B2 | 2/2003 | Zhao et al. |
| 6,723,176 B2 * | 4/2004 | Quadakkers et al. ......... 148/240 |
| 7,622,152 B2 * | 11/2009 | Kim et al. .................. 427/248.1 |

FOREIGN PATENT DOCUMENTS

EP 1 229 146 A2 8/2002

OTHER PUBLICATIONS

Li, Key Engineering Materials, vols. 280-283, 2005, p. 907-910.*
Search Report of corresponding FR 10 03882, dayed May 18, 2011, 2 pages.
Chen et al., "Deposition of Cr-modified silicide coatings on Nb-Si system intermetallics," Intermetallics, vol. 15, No. 5-6, Apr. 19, 2007, pp. 805-809, XP022035047.

(Continued)

*Primary Examiner* — Joseph Miller, Jr.
(74) *Attorney, Agent, or Firm* — Christie, Parker & Hale, LLP

(57) ABSTRACT

The invention relates to a method for forming a protective coating against high-temperature oxidation on a surface of a refractory composite material based on silicon and niobium, wherein chromium present on the surface to be protected is reacted with a reactive gas which contains silicon and oxygen in order to produce a composite coating having two phases, a first phase of which is an oxide phase based on silica which has viscoplastic properties and a second phase of which is based on silicon, chromium and oxygen, and wherein the first phase and second phase are coalesced at high temperature, which allows a protective coating to be formed in which the second phase acts as a reservoir to reform, during operation, the first phase by means of reaction with an oxidising gas. The invention is preferably used in the field of aeronautical engines.

15 Claims, 2 Drawing Sheets

(56) References Cited

OTHER PUBLICATIONS

Geng, et al., "A thermo-gravimetric and microstructural study of the oxidation of $Nb_{ss}/Nb_5Si_3$—based in situ composites with Sn addition," ScienceDirect, Intermetallics 15 (2007), pp. 270-281.

Bewlay, et al., "The Balance of Mechanical and Environmental Properties of a Multielement Niobium-Niobium Silicide-Based *In Situ* Composite," Metallurgical and Materials Transactions A, Dec. 1996, pp. 3801-3808, vol. 27A.

Guo, et al., "Oxidation Behavior and Pack Siliconized Oxidation-resistant Coatings of an Nb-based Ultrahigh Temperature Alloy," Materials Science Forum, 2007, pp. 371-374, vols. 561-565, online at http://www.scientific.net, Trans Tech Publications, Switzerland.

Li, et al., "Development and Oxidation Resistance of Si-modifide MCrAlY Coatings on Nb-base Alloy," Materials Science Forum, 2007, pp. 1721-1724, vols. 546-549, online at http://www.scientific.net, Trans Tech Publications,. Switzerland.

Tian, et al., "Structure of Al-modified silicide coatings on an Nb-based ultrahigh temperature alloy prepared by pack cementation techniques," ScienceDirect, Surface & Coatings Technololgy 203, journal homepage: www.elsevier.com/locate/surfcoat, 2009, pp. 1161-1166.

Tian, et al., "Structure and oxidation behavior of Si-Y co-deposition coatings on an Nb silicide based ultrahigh temperature alloy prepared by pack cementation technique," ScienceDirect, Surface & Coatings Technology 204, journal homepage: www.elsevier.com/locate/surfcoat, 2009, pp. 313-318.

\* cited by examiner

METHOD FOR FORMING A PROTECTIVE COATING AGAINST HIGH-TEMPERATURE OXIDATION ON A REFRACTORY COMPOSITE MATERIAL BASED ON SILICON AND NIOBIUM

CROSS-REFERENCE TO RELATED APPLICATION

This application claims priority to and the benefit of French Patent Application Number 10/03882, filed on Sep. 30, 2010.

The invention relates to a method for forming a protective coating against high-temperature oxidation on a surface of a refractory composite material based on silicon and niobium. It also relates to components of composite material, in particular aeronautical engine components, protected in this manner using this method.

The mechanical strength and oxidation resistance of materials used in turbines of aeronautical engines limit the performance levels of the engines. Recent prospective studies show that, for turbine blades, for which the wall temperature currently reaches 1050-1100° C., the optimisation of the compositions of the metal alloys used (nickel-based superalloys) and the production methods, the improvement of internal cooling circuits of the components and the use of thermal insulation coatings will not allow the intended wall temperatures in the order of 1300° C. to be reached. One method envisaged for operating at such temperatures is the use of composite materials which are constituted by two types of highly refractory phases, one of which is metal Mss (in which Mss refers to a phase in solid solution and M is an Nb base alloyed with numerous elements such as Si, Ti, Cr, Hf, Al, etc.) conferring on the material adequate resistance at ambient temperature, and the other of which is intermetallic $M_5Si_3$ which provides the strength and creep resistance desired at high temperature. These materials are referred to below as "composite materials of the type Nb—Si". These are the materials to which the invention relates.

The use of these composite materials of the type Nb—Si is also envisaged at a medium temperature (700-1000° C.) for low-pressure turbines by replacing the blades currently in use, which are cast from nickel-based superalloys and whose density varies from 7.75 to 8.6. The use of these materials of the type Nb—Si whose density varies between 6.6 and 7.2 allows the structures to become lighter, which is an important strategic factor for motorists, for example.

However, their development is slowed by their low level of resistance to oxidation at medium or high temperature, in spite of a large number of "favourable" elements which are added to their initial composition (Hf, Si, Cr, B, C, Zr, Ti and Al). When such a material is subjected to the operating conditions of gas turbines, it is destroyed by oxidation in a time of between a few minutes and some tens of hours, depending on the grade used.

It appears that generally above 800° C. oxygen penetrates into the metal phases in order to oxide them first, initially leaving the silicide phases ($M_5Si_3$) virtually non-attacked. It appears that the interfaces and the grain joints assist the diffusion of oxygen. Then, the $M_5Si_3$ phases become oxidised in turn.

Another problem is that, at low temperature, typically between 500 and 800° C., this type of material is incapable of rapidly developing a layer of protective oxides owing to very low diffusion kinetics in the metal phases Mss. This results in preferential oxidation of the $M_5Si_3$ phases which form crumbly non-protective oxides which brings about a destruction of these phases and, gradually, of the material. This type of oxidation is referred to as the "plague effect". Solutions for protecting this family of alloys have already been proposed. For example, in the U.S. Pat. No. 4,904,546 (M. R. Jackson, 27 Feb. 1990), there is proposed a protection based on ruthenium by means of physical deposition, of the plasma projection type, corresponding to the formula:

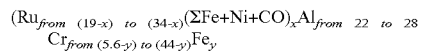

$(Ru_{from\ (19-x)\ to\ (34-x)}(\Sigma Fe+Ni+CO)_xAl_{from\ 22\ to\ 28}$
$Cr_{from\ (5.6-y)\ to\ (44-y)}Fe_y$ with the preferred composition: $Cr_{55}Al_{20}Ru_{14}Fe_{11}$.

U.S. Pat. No. 4,980,244 by the same Applicant teaches a variant of this coating in which yttrium is added at a level of 0.2 atomic % in place of ruthenium. In addition to the difficulty of applying such a coating, it should be noted that the increasing scarcity of resources means that the selection of ruthenium is not tenable.

In another U.S. Pat. No. 5,019,334, M. R. Jackson proposes using a compound MCrAlY (where M=Ni, Co and/or Fe) as a protective coating for these alloys and accommodating the thermal expansion differential by adding alumina to the coating. Optionally, use of the alloys RuCrAl described above is suggested.

Another solution, proposed by M. R. Jackson et al. in U.S. Pat. No. 5,932,033 involves increasing the intrinsic resistance of the material to oxidation at high temperature owing to an increase in its content of chromium. Consequently, new additional phases, that is to say, the Laves phases, which are resistant to oxidation, of composition $Cr_2M$ (where M=Nb+Ti+Hf) are created in this composite. The material described in this manner can be used in its existing state or as a coating. Another version of this material is taught in the U.S. Pat. No. 6,419,765. These two materials are supposed to function without a coating for at least 100 hours at a temperature of between 1400 and 1600° F. (745 and 856° C.). However, Laves phases are well known for being very brittle.

U.S. Pat. No. 6,521,356 (Zhao et al.) teaches that it is possible to protect this type of material with a coating based on niobium, silicon, titanium and chromium, this coating being compatible with the addition of a thermal barrier. This coating contains numerous elements and is deposited by means of a dispersion (slurry): the component to be coated is immersed in a dispersion of powders in a viscous organic binding agent. The preferred composition contains 66% of silicon, 10% of titanium, 5% of chromium and 19% of niobium (atomic %). This composition complies with the more general following formula: $Nb_{1-x-y}Ti_xCr_ySi_2$ where $1>(x+y) \geq 0$. However, this phase is brittle and may generate cracks at the interface. It is possible to find in the composition of this protection elements such as boron, tin and iron as long as their concentration does not exceed 5 atomic %. Finally, it should be noted that this protection may be complemented by the deposit of a conventional thermal barrier which is composed either of zirconium, zirconium stabilised by yttrium, zirconium (zirconium silicate, $ZrSiO_4$) and/or mullite.

All the coatings created by the various techniques of protection by means of physical deposition, plasma deposition etc., do not allow the composite material of the type Nb—Si to be protected for the applications intended since the coating has a thermal expansion coefficient which is different from that of the material and any cracking brings about catastrophic oxidation of the composite material of the Nb—Si type. It should be noted that this material is destroyed after 1 cycle of one hour under air at 1200° C. and 2 cycles of one hour under air at 1000° C.

According to Guo, X. P., Zhao, L. X., Guan, P., Kusabiraki, K. 2007 *Materials Science Forum* 561-565 (PART 1), pp. 371-374, it is possible to protect this type of material with a silicon based coating which is deposited by means of pack cementation, but with a halogenated activator, of the ammonium halide type, which when decomposing forms a gaseous halogenated acid. Xiaoxia Li and Chingen Zhou, 2007 *Materials Science Forum* 546-549 (PART 3), pp. 1721-1724, have applied siliconisation by means of pack cementation using a halogenated activator to a niobium silicide alloy coated with an MCrAlY deposited by means of plasma projection under air, the coating obtained only by means of siliconisation not being sufficiently protective.

Chen Chen et al. in *Intermetallics*, 15 (2007) 805-809 also propose protecting a material of the type Nb—Si with a coating of silicon also comprising chromium. The chromium is deposited by means of pack cementation based on chromium powder and a halogenated activator, of the ammonium halide type, which forms a gaseous halogenated acid when decomposing. The silicon is deposited either by means of pack cementation based on silicon powders and a halogenated activator, or by molten salts.

Still using methods of pack cementation with a halogenated activator, Tian et al. propose a coating based on silicon and comprising either aluminium (Surface and Coating Technology, 203 (2009) 1161-1166) or yttrium (Surface and Coating Technology, 204 (2009) 313-318).

However, these techniques using halogenated activators form, with the components of the niobium silicides, halogenated compounds which are volatile, which locally degrades the microstructure. It is therefore necessary to develop a technique which allows a coating to be created by means of diffusion without using halogenated gas.

Furthermore, the description of all of these techniques for protection of materials of the type Nb—Si shows that effective protection of niobium silicon alloys is very difficult to obtain, both at the temperature referred to as "plague corrosion" temperature and at high temperature. In order to avoid this "plague effect", the silicide must be isolated from the atmosphere.

An object of the invention is in particular to overcome all these disadvantages.

The work carried out by the Applicant has shown that the protection of a silicide at high temperature cannot be ensured only by a refractory and adhesive coating which is sealed or which slows the diffusion of oxygen. This coating must further have good viscoplastic properties in order to be able to fill the cracks during operation and to be self-healing in the event of the oxide becoming flaked or volatile.

The invention proposes to this end a method for forming a protective coating against high-temperature oxidation on a surface of a refractory composite material based on silicon and niobium, in which chromium present on the surface to be protected is reacted with a reactive gas which contains silicon and oxygen in order to produce a composite coating having two phases, a first phase of which is an oxide phase based on silica which has viscoplastic properties and a second phase of which is based on silicon, chromium and oxygen, and in which the first phase and second phase are coalesced at high temperature, which allows a protective coating to be formed in which the second phase acts as a reservoir to reform, during operation, the first phase by means of reaction with an oxidising gas.

In this manner, in order to protect that composite material of the type Nb—Si, the method of the invention allows a composite coating to be created which is constituted by two phases with different expansion coefficients in order to accommodate the thermomechanical constraints during operation.

The first phase is constituted by an oxide phase based on silica, which is protective and viscoplastic at the temperature for use. It may further contain melting elements of the boron and/or germanium type in order to adjust its viscoplastic properties in accordance with the desired temperature range.

The second phase substantially contains silicon, chromium and oxygen. It may also contain other elements, for example, boron and/or aluminium and/or iron. This second phase will act as a reservoir in order to reform, during operation, the first phase by means of reaction with oxygen or any other oxidising gas, for example, water vapour.

In this manner, when a component of composite material of the Nb—Si type, provided with a coating according to the invention, is subjected to a gaseous oxidising atmosphere at high temperature, the second phase will allow the first phase to be reformed.

The technique currently preferred in order to allow all of these "elements" to be obtained is a technique derived from the technique referred to as "VLS" (Vapour Liquid Solid). This "VLS" technique may be combined in this instance with a pre-deposit metal phase if the element (typically chromium) is not present in sufficient quantity in the composite material of the type Nb—Si.

An object of the invention is therefore to develop a technique which is suitable for this type of composite Nb—Si material and which allows the formation of a coating which is also composite based on silica/silicon, chromium, oxygen doped and/or modified with a melting element, such as boron and/or germanium.

The basic notion is to react the chromium element, either from the composition of the alloy or added beforehand, with gases containing silicon, oxygen and optionally other elements, such as boron, germanium, etc. The techniques for adding chromium may be of the wet type (electrolytic coating, molten salts, for example) or physical (cathode spraying, PVD, magnetron, for example), or any other chromium depositing technique which is well known to the person skilled in the art. The gases which supply the silicon, the oxygen and any other element of the type B, Ge, etc., are produced in situ in the reactor from standard commercial powders.

Other complementary features of the invention are set out below:

the first phase is based on silica ($SiO_2$) and the second phase based on silicon, chromium and oxygen (CrSiO);

the reactive gas contains silicon monoxide (SiO) and is produced in situ, for example, from a donor cement which contains silica ($SiO_2$) subjected to a temperature greater than or equal to 1450° C.; the silicon monoxide may be obtained by activating a mixture of silicon powder and silica;

the donor cement contains, for example, a mixture of silica ($SiO_2$) and silicon carbide (SiC) in the form of powder; this cement may be replaced with a powdered SiO whose evaporation temperature is between 1100 and 1400° C.;

the first phase further contains melting elements of the boron and/or germanium type, which allows the viscoplastic properties of this phase to be adjusted in accordance with the operating temperature range;

the first phase further contains boron and the reactive gas contains silicon monoxide (SiO) and boron monoxide (BO);

there is first reacted on the composite material a first reactive gas containing silicon monoxide (SiO) produced from the donor cement which contains a mixture of silica ($SiO_2$) and silicon carbide (SiC) in the form of powder, then a second reactive gas which contains silicon monoxide (SiO) and boron monoxide (BO) produced from a second donor cement which contains a mixture of silica ($SiO_2$) and boron carbide ($B_4C$) in the form of powder;

the chromium present on the surface to be protected is completely or partially a component of the composite material based on silicon and niobium;

the chromium present on the surface to be protected is obtained completely or partially by means of a predeposit on the surface to be protected in order to form a layer of the desired thickness;

the thickness of the chromium layer is between 5 and 20 μm, the preferred thickness being 15 μm;

the predeposit of chromium is obtained by means of a depositing technique selected from the following group: electrolytic depositing, depositing by means of cathode spraying;

there is formed beforehand on the surface to be protected a deposit of tin, preferably followed by a thermal processing operation at reduced pressure;

there is formed beforehand on the surface to be protected a deposit of a precious metal which is selected from platinum, palladium and gold, preferably followed by an interdiffusion annealing operation;

there is formed beforehand on the surface to be protected a deposit of titanium nitride; and the composite material based on silicon and niobium has the general composition Nb 47%, Si 16%, Ti 25%, Al 2%, Cr 2% and Hf 8% (atomic %).

Another aspect of the invention relates to the coating itself obtained by implementing the method above and a component of composite material based on silicon and niobium, one surface of which is provided with a protective coating, such as that obtained by implementing the method above.

In the following detailed description, given purely by way of example, reference is made to the appended drawings, in which.

Figure 1:
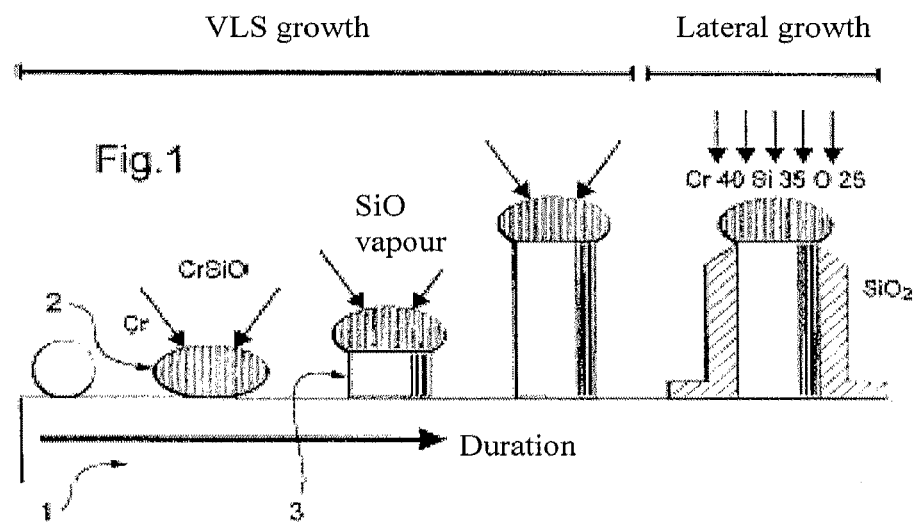
FIG. 1 is a graph illustrating the formation of a protective coating according to the invention as a function of time.

Reference is first made to the graph of FIG. 1. As mentioned above, the technique currently preferred for producing a protective deposit according to the invention is derived from the technique known as "VLS". It should be noted that this technique involves placing a material in a chamber containing a specific gas. Liquid drops are formed, either from a reaction between the gas and "elements or impurities" of the material, or from a reaction between the gas and a generally nanometric predeposit.

By means of catalytic effect, the gas is adsorbed in the droplet and, when there is oversaturation of the gas in the droplet, a nucleation is produced and a growth of an equiaxed crystal.

This technique is used currently in various technical fields in order to form nanowires, whiskers, nanostructures of semiconductors, etc., for electronics or catalysts.

In the case of FIG. 1, a pre-deposit of chromium is formed on a surface of a composite material 1 of the type Nb—Si with a thickness of 15-20 μm and the whole is placed in a chamber where SiO gas is produced in situ.

"Droplets" or bubbles 2 of CrSiO are formed in which the SiO is adsorbed. When the composition $Cr_{40}Si_{35}O_{25}$ is obtained, there is nucleation of $SiO_2$ which grows in the form of rods 3. At the testing temperature (1450° C.), the silica is plastic and there is therefore coalesence of the phases and collapse of the bubbles of CrSiO which coalesce. The rod/bubble structure typical of a VLS growth is found only at the surface. Part of the chromium has also diffused in the subjacent composite material based on Nb—Si and has therefore ensured the anchoring of the coating (diffusion zone).

FIG. 1 illustrates from left to right the formation of the droplet or bubble 2 of CrSiO by reacting SiO gas on the surface of a sample in the presence of chromium, then the formation of rods 3 during the VLS growth phase, in accordance with the duration. This phase is followed by a lateral growth phase of $SiO_2$ as seen in the right-hand portion of FIG. 1.

In the specific case of FIG. 1, chromium is supplied by means of a predepositing operation. However, in a variant, it could also be supplied directly from the alloy, of which it forms one of the components. It is also possible to supply the chromium both from a component of the alloy and from a predeposit on the surface to be protected.

Figure 2:
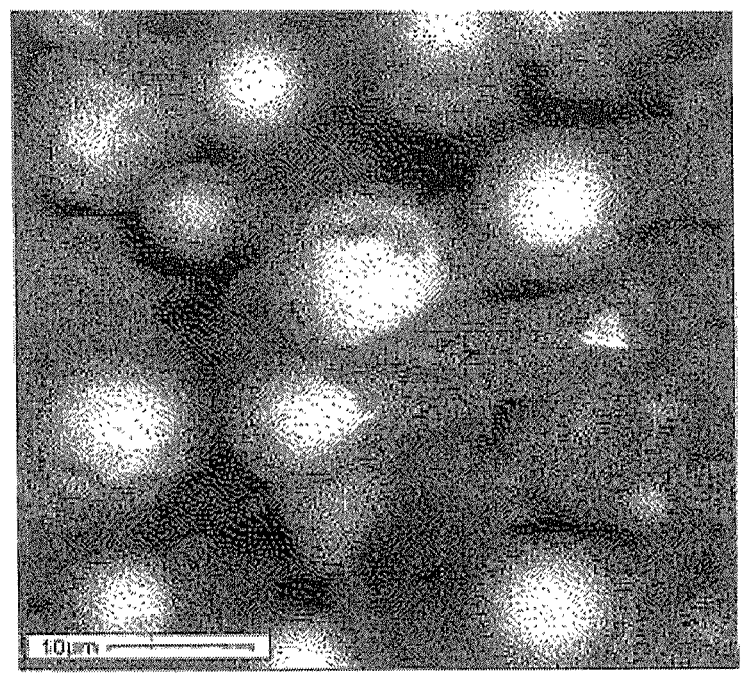
FIG. 2 is a surface view, drawn to an enlarged scale, of a composite material of the Nb—Si type protected by a deposit of chromium followed by a processing operation using an SiO gas.

FIG. 2 illustrates a surface view, drawn to an enlarged scale (enlargement factor ×2000 with scale 10 μm illustrated), where the typical rod/bubble structure of a VLS growth can be seen. However, this structure is found only at the surface.

Figure 3:
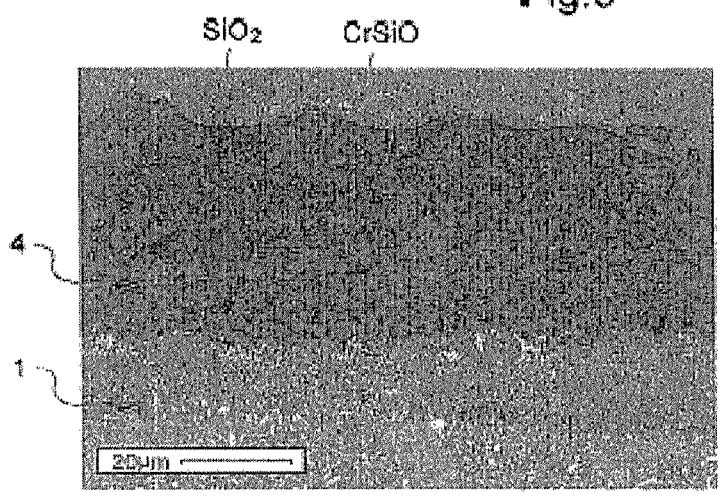
FIG. 3 is a corresponding micrographic sectioned view, drawn to an enlarged scale, of the composite material of FIG. 2.

The section of FIG. 3 (enlargement factor ×1000 with scale 20 μm illustrated) shows that the composite material 1 is found to be surmounted by an anchoring zone 4 and then surmounted by the coating with the phases $SiO_2$ and CrSiO which have coalesced together.

The SiO gas is produced in situ in an oven from an admixture $SiO_2$/SiC well known for making this gas. It cannot be obtained below 1450° C. It is used in the protection of carbon-carbon composites in order to convert the carbon into silicon carbide in accordance with the formula $2C+SiO=SiC+CO$.

This gas has never been produced in order to be included in a coating by a growth of the VLS type.

It is also possible to incorporate boron. To this end, the powder mixture has been modified by a new mixture $SiO_2$/$B_4C$ which has never been used before.

Figure 4:
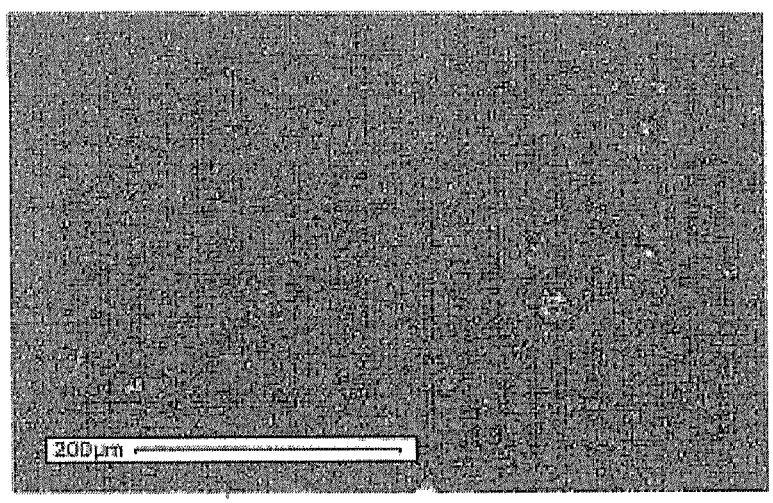
FIG. 4 is a surface view, drawn to an enlarged scale, of a composite material of the Nb—Si type protected by a deposit of chromium followed by a processing operation using the SiO gas and a processing operation using the SiO/BO gas.

When there is deposited on a composite material of the Nb—Si type a deposit of chromium and it is placed in a chamber where SiO gas is produced from SiO/SiC, then in a chamber where SiO/BO gas is created from a powder $SiO_2$/$B_4C$, boron is incorporated, which allows a borosilicate glass to be obtained at the surface which is more plastic than silica. An example is given by the micrography of FIG. 4 (enlargement factor ×1000 with scale 200 μm illustrated). This shows a composite material of the type Nb—Si first protected by a predeposit of chromium followed by a processing operation using SiO gas and a processing operation using SiO/BO gas. The appearance of the coating is more glazed at the surface compared with FIG. 2.

The invention will be further described with reference to the following non-limiting examples:

EXAMPLE 1

A protective coating is constructed on an alloy of niobium and silicon referred to as MASC (Metal And Silicide Composite) having the general composition Nb 47%, Si 16%, Ti 25%, Al 2%, Cr 2% and Hf 8% (atomic %). This alloy was developed by General Electric (B. P. Bewlay, M. R. Jackson, and H. A. Lipsitt "The Balance of Mechanical and Environmental Properties of a Multielement Niobium-Niobium Silicide-Based In Situ Composite", Metall. Mater. Trans. 27A (1996) 3801-3808; U.S. Pat. No. 5,833,773). It is composed of a plurality of refractory phases, a metal one (rich solid solution based on niobium designated $M_{ss}$) and a plurality of niobium silicide phases (of the type $Nb_3Si$ and $Nb_5Si_3$).

The sample is placed in or above a silicon donor cement having the composition:

| | |
|---|---|
| $SiO_2$ | 75% |
| SiC | 25% (percentages by mass) |

These percentages correspond to the stoichiometric composition.

Once brought to the temperature of 1450° C. under a flow of argon, this cement allows silicon to be transported to the surface of the substrate. Following this operation, a coating is obtained based on $SiO_2$+CrSiO whose properties of oxidation at high temperature are exceptional.

At 1200° C. under air with cyclical oxidation, the service-life of the MASC alloy protected in this manner is 16 times greater than that of the same non-protected alloy.

EXAMPLE 2

A protective coating is constructed on an alloy of niobium and silicon referred to as MASC (Metal And Silicide Composite) as described in example 1.

To this end, the substrate is first coated with a deposit of electrolytic chromium produced under the following conditions:

Chromium trioxide referred to as chromic acid ($CrO_3$): 250 g·L$^{-1}$

Sulphuric acid ($H_2SO_4$): 2.5 g·L$^{-1}$

Current density: 50 A/dm$^2$

T: 60-65° C.

The electrolysis lasts between 0.5 and 3 hours, depending on the thickness desired. A layer of between 5 and 20 μm is deposited, the preferred thickness being 15 μm.

Optionally, the substrate coated with chromium may then be subjected to a thermal diffusion processing operation, for example, of 2 hours at 900° C. at reduced pressure greater than 10$^{-3}$ Pa. Following this operation, the sample is placed in or above a silicon donor cement having the composition

| | |
|---|---|
| $SiO_2$ | 75% |
| SiC | 25% (percentages by mass) |

Once brought to the temperature of 1450° C. under a flow of argon, this cement allows silicon to be transported to the surface of the substrate. Following this operation, a coating is obtained based on $SiO_2$+CrSiO whose properties of oxidation at high temperature are exceptional. The sample has a mass gain of 1 mg/cm$^2$ after 45 cycles of oxidation of one hour at 1200° C., whilst a non-protected sample is destroyed in less than one hour.

EXAMPLE 3

A protective coating is constructed on an alloy of niobium and silicon referred to as MASC (Metal And Silicide Composite) as described in example 1.

To this end, the substrate is first coated with a deposit of chromium by means of triode cathode spraying. The deposited layer has a thickness of between 5 and 20 μm, the preferred thickness being 15 μm. The sample is placed in or above a silicon donor cement having the composition:

| | |
|---|---|
| $SiO_2$ | 75% |
| SiC | 25% (percentages by mass) |

Once brought to the temperature of 1450° C. under a flow of argon, this cement allows silicon to be transported to the surface of the substrate. Following this operation, a coating is obtained based on $SiO_2$+CrSiO whose properties of oxidation at high temperature are exceptional.

By way of example, a sample protected with this coating was oxidised for 45 cycles of one hour at a temperature of 1200° C. Following the test, it had a mass loss of 1.63 mg/cm$^2$ whilst the same non-protected sample is completely destroyed in less than one hour.

EXAMPLE 4

The procedure is as in the example above, apart from the fact that the cement is a donor of both silicon and boron. The cement has the following composition:

| | |
|---|---|
| $SiO_2$ | 50% |
| $B_4C$ | 50% (percentages by mass) |

Also in this instance, the results obtained are exceptional: the substrate MASC is coated with a deposit of silicon dioxide, chromium oxide, chromium boride and chromium oxysilicide whose properties of oxidation at high temperature are exceptional.

For example, the sample oxidised for 20 cycles of one hour at 1000° C. had a mass loss of 0.14 mg/cm$^2$ whilst the same non-protected sample is completely destroyed at the same temperature in one hour.

EXAMPLE 5

The procedure is as in the example above, apart from the fact that the cement which is a donor of both silicon and boron is richer in boron than in the preceding case. The cement has the following composition:

| | |
|---|---|
| $SiO_2$ | 16% |
| $B_4C$ | 84% (percentages by mass) |

In this instance also, the coating obtained has exceptional resistance to oxidation at high temperature.

EXAMPLE 6

The procedure is as in Example 3, then a second processing operation is carried out in which the sample is placed in or above a cement which donates both silicon and boron. The second cement has the following composition:

| | |
|---|---|
| SiO$_2$ | 50% |
| B$_4$C | 50% (percentages by mass) |

The sample is subjected to an oxidation test of 50 cycles of one hour at 1000° C. Following this test, it has a mass gain of 0.74 mg/cm$^2$ whilst the same non-protected sample is completely destroyed at this temperature in one hour.

EXAMPLE 7

The procedure is as in Example 3, then a second processing operation is carried out in which the sample is placed in or above a cement which donates both silicon and boron but is richer in boron than that of example 6. The second cement has the following composition:

| | |
|---|---|
| SiO$_2$ | 16% |
| B$_4$C | 84% (percentages by mass) |

The sample is subjected to an oxidation test of 300 cycles of one hour at 1000° C. Following this test, it has a mass loss of 1.09 mg/cm$^2$ whilst the same non-protected sample is completely destroyed at this temperature in one hour.

However, it should be noted that, in the event of total destruction of the coating, by means of accidental cracking, for example, and taking into account the low level of resistance to oxidation of materials of the Nb—Si type, there is oxidation of the subjacent substrate which brings about flaking of the coating and the destruction of the material.

In order to overcome this, it has been proposed, before producing the coating as described above, that the surface of the alloy which will be in contact with the coating be modified locally either by an element which is known to improve the oxidation resistance of solid substrates such as tin or a precious metal (platinum, gold) [Geng et al Intermetallics 15 (2007) 270-281] or by depositing an oxygen diffusion barrier such as, for example, titanium nitride whose properties as a diffusion barrier are well known to the person skilled in the art.

EXAMPLE 8

A protective coating is constructed on an alloy of niobium and silicon referred to as MASC. To this end, the substrate is first coated with a deposit of tin of from 4 to 7 μm followed by a thermal processing operation at reduced pressure at 700° C. for a duration of from 12 to 32 hours. Then, the procedure is as in example 1.

In this instance also, the results obtained are exceptional: the MASC substrate is coated by a deposit whose oxidation properties at high temperature are exceptional.

EXAMPLE 9

A protective coating is constructed on an alloy of niobium and silicon referred to as MASC. To this end, the substrate is first coated with a deposit of tin of from 4 to 7 μm followed by a thermal processing operation at reduced pressure at 700° C. for a duration of from 12 to 32 hours. Then, the procedure is as in example 2.

In this instance also, the results obtained are exceptional: the MASC substrate is coated by a deposit whose oxidation properties at high temperature are exceptional.

EXAMPLE 10

A protective coating is constructed on an alloy of niobium and silicon referred to as MASC. To this end, the substrate is first coated with a deposit of tin of from 4 to 7 μm followed by a thermal processing operation at reduced pressure at 700° C. for a duration of from 12 to 32 hours. Then, the procedure is as in examples 3 to 7 in accordance with the properties desired for the coating.

In this instance also, the results obtained are exceptional: the MASC substrate is coated by a deposit whose oxidation properties at high temperature are exceptional.

EXAMPLE 11

Examples 8 to 10 are repeated, with the deposit of tin being replaced by a deposit of platinum obtained using one of the techniques well known to the person skilled in the art, optionally followed by an interdiffusion annealing operation.

In all cases, a coating is obtained with good oxidation properties at high and medium temperature.

EXAMPLE 12

Examples 8 to 10 are repeated, with the deposit of tin being replaced by a deposit of palladium obtained using one of the techniques well known to the person skilled in the art, optionally followed by an interdiffusion annealing operation.

In all cases, a coating is obtained with good oxidation properties at high and medium temperature.

EXAMPLE 13

Examples 8 to 10 are repeated, with the deposit of tin being replaced by a deposit of gold obtained using one of the techniques well known to the person skilled in the art, optionally followed by an interdiffusion annealing operation.

In all cases, a coating is obtained with good oxidation properties at high and medium temperature.

EXAMPLE 14

Examples 8 to 10 are repeated, with the deposit of tin being replaced by a deposit of titanium nitride obtained using one of the techniques well known to the person skilled in the art.

In all cases, a coating is obtained with good oxidation properties at high and medium temperature.

EXAMPLE 15

The above examples 1, 2, 3, 6 to 14 are repeated with the SiO$_2$/SiC cement (silica/silicon carbide) being replaced with a commercial SiO powder which by heating evaporates into SiO gas as mentioned in the U.S. Pat. No. 6,313,015.

EXAMPLE 16

The above examples 1, 2, 3, 6 to 14 are repeated with the only difference that the source of silicon monoxide gas (SiO) is obtained by activation of the mixture of powders of silicon (Si) and silica (SiO$_2$), which activation is carried out by means of thermal processing, laser heating, magnetron or triode cathode plasma, as mentioned in the U.S. Pat. No. 6,313,015. Also in this instance, the coating obtained has exceptional resistance to oxidation at high temperature. The same result can be obtained by means of activation of targets obtained by means of compacting the powders mentioned or from targets which are cut from solid material of the same composition as the powders mentioned.

The invention is preferably used in the field of aeronautical engines.

The invention claimed is:

1. Method for forming a protective coating against high-temperature oxidation on a surface of a refractory composite material comprising silicon and niobium, characterised in that chromium present on the surface to be protected is reacted with a reactive gas which contains silicon and oxygen in order to produce a composite coating having two phases, the first phase of which is an oxide phase comprising silica ($SiO_2$) which has adjustable viscoplastic properties and the second phase of which comprises silicon, chromium and oxygen (CrSiO), and in that the first phase and second phase are coalesced at high temperature, which allows a protective coating to be formed in which the second phase acts as a reservoir to reform, during operation, the first phase by means of reaction with an oxidising gas.

2. Method according to claim 1, wherein the reactive gas contains silicon monoxide (SiO) and is produced in situ from a donor cement which contains silica ($SiO_2$) subjected to a temperature greater than or equal to 1450° C.

3. Method according to claim 2, wherein the donor cement contains a mixture of silica ($SiO_2$) and silicon carbide (SiC) in the form of powder.

4. Method according to claim 1, wherein the first phase comprising silica ($SiO_2$) further contains melting elements of the boron and/or germanium type which allows the viscoplastic properties of this phase to be adjusted in accordance with the operating temperature range.

5. Method according to claim 4, wherein the first phase further contains boron and wherein the reactive gas contains silicon monoxide (SiO) and boron monoxide (BO).

6. Method according to claim 5, wherein there is first reacted on the composite material a first reactive gas containing silicon monoxide (SiO) produced from a donor cement which contains silica ($SiO_2$) and silicon carbide (SiC) in the form of powder, then a second reactive gas which contains silicon monoxide (SiO) and boron monoxide (BO) produced from a second donor cement which contains silica ($SiO_2$) and boron carbide ($B_4C$) in the form of powder.

7. Method according to claim 1, wherein all or part of the chromium present on the surface to be protected originates from the composite material based on silicon and niobium.

8. Method according to claim 1, wherein all or part of the chromium present on the surface to be protected is obtained by means of a predeposit on the surface to be protected in order to form a layer of the desired thickness.

9. Method according to claim 8, wherein the predeposit is obtained by means of an electrolytic depositing technique or depositing by means of cathode spraying and the thickness of the layer being between 5 and 20 µm.

10. Method according to claim 1, wherein there is formed beforehand on the surface to be protected a deposit of tin.

11. Method according to claim 1, wherein there is formed beforehand on the surface to be protected a deposit of a precious metal which is selected from platinum, palladium and gold.

12. Method according to claim 1, wherein there is formed beforehand on the surface to be protected a deposit of titanium nitride.

13. Method according to claim 9, wherein the thickness of the layer being 15 µm.

14. Method according to claim 10, wherein the forming of the deposit of tin is followed by a thermal processing operation at reduced pressure.

15. Method according to claim 11, wherein forming of the deposit of precious metal is followed by an interdiffusion annealing operation.

* * * * *